US008830688B2

(12) United States Patent
Wu

(10) Patent No.: US 8,830,688 B2
(45) Date of Patent: *Sep. 9, 2014

(54) WIRELESS SIGNAL RECEIVER

(75) Inventor: Cheng-Cheng Wu, Taipei County (TW)

(73) Assignee: Dexin Corporation, Taipei Hsien (TW)

( * ) Notice: Subject to any disclaimer, the term of this patent is extended or adjusted under 35 U.S.C. 154(b) by 306 days.

This patent is subject to a terminal disclaimer.

(21) Appl. No.: 13/324,224

(22) Filed: Dec. 13, 2011

(65) Prior Publication Data

US 2012/0081863 A1    Apr. 5, 2012

Related U.S. Application Data

(62) Division of application No. 12/073,372, filed on Mar. 5, 2008, now Pat. No. 8,139,366.

(51) Int. Cl.
*H05K 5/00* (2006.01)
*H04B 1/38* (2006.01)
*H05K 1/11* (2006.01)

(52) U.S. Cl.
CPC .............. *H04B 1/3816* (2013.01); *H05K 1/117* (2013.01)

USPC .......................... 361/759; 361/752; 361/726

(58) Field of Classification Search
USPC .................................. 361/759, 686, 752, 726
See application file for complete search history.

(56) References Cited

U.S. PATENT DOCUMENTS 7,269,004 B1 *   9/2007   Ni et al. .................. 361/679.41

* cited by examiner

*Primary Examiner* — Andargie M Aychillhum
(74) *Attorney, Agent, or Firm* — Rosenberg, Klein & Lee

(57) ABSTRACT

A wireless signal receiver includes a housing, and a receiving module. The housing has a front portion, a rear portion and two side portions, and the housing has an installing space having an opening. The opening is located at the front portion. The receiving module is located in the installing space of the housing, and includes a circuit board, a receiving chip electrically coupled with the circuit board, and electric-conducting contacting portions electrically coupled with the circuit board. The electric-conducting contacting portions exposes to outside of the opening. Thereby, the total dimension is reduced.

2 Claims, 5 Drawing Sheets

WIRELESS SIGNAL RECEIVER

RELATED APPLICATIONS

This application is a Divisional patent application of co-pending application Ser. No. 12/073,372, filed on 5 Mar. 2008, now pending. The entire disclosure of the prior application, Ser. No. 12/073,372, from which an oath or declaration is supplied, is considered a part of the disclosure of the accompanying Divisional application and is hereby incorporated by reference.

BACKGROUND OF THE INVENTION

1. Field of the Invention

The present invention relates to a wireless signal receiver. In particular, this invention relates to a wireless signal receiver that receives signal from a wireless computer peripheral.

2. Description of the Related Art

As the technology is developed and the requirement of a comfortable control for people, the computer peripheral has a wireless design, such as a wireless mouse, a wireless keyboard, a wireless controller, or a wireless joystick, etc. The wireless transmission ways can be implemented by the RF or the Bluetooth. The user merely needs to plug a wireless receiver into the universal serial bus (USB) port of the computer peripheral so that the wireless receiver can receive signals from the wireless computer peripheral. Thereby, the computer and the wireless computer peripheral can make a wireless transmission and a wireless control. Therefore, the user can freely control the wireless computer peripheral, without restricted by the wired transmission.

The wireless receiver for the computer peripheral of the prior art includes a USB plug with an USB interface, a signal receiving module combining with the rear side of the USB plug and electrically connected with the USB plug, and a housing located at with the rear side of the USB plug and wrapping the signal receiving module. By plugging the USB plug into the USB port of the computer, the signal is received.

However, the length of the USB plug has been standardized. The total length of the wireless receiver, including the USB plug, the signal receiving module and the housing, is two to three times of the standard length of the US plug (the length of the wireless receiver is at least over 4 cm. Therefore, for the wireless computer peripheral with a receiving space for receiving the wireless receiver, especially for a wireless mouse, the receiving space of the wireless computer peripheral has to be large enough. It is difficult to design the wireless mouse and dispose the other elements in the wireless mouse. The cost increases, and the dimension of the wireless computer peripheral cannot be easily miniaturized.

SUMMARY OF THE INVENTION

One particular aspect of the present invention is to provide a wireless signal receiver that its total length is reduced.

The wireless signal receiver includes a housing having a front portion, a rear portion and two side portions, and a receiving module. The housing has an installing space having an opening. The opening is located at the front portion. Protruding ribs respectively protrude from each of the two wall surfaces that form the two side portions of the housing, and each of the protruding ribs extends from the front portion of the housing to the rear portion. The receiving module is located in the installing space of the housing. The receiving module includes a circuit board, a receiving chip electrically coupled with the circuit board, and electric-conducting contacting portions electrically coupled with the circuit board. The electric-conducting contacting portions exposes to outside of the opening.

The present invention has the following characteristics. By locating the receiving module in the installing space of the housing, the receiving module is directly received in the housing and the electric-conducting contacting portions directly exposes to outside of the opening of the front portion of the housing. Thereby, the total length is reduced. Comparing to the prior art, the required interior space of the wireless computer peripheral for the wireless signal receiver is reduced.

Furthermore, because the two protruding ribs are formed at the front portion of the housing, the protruding ribs can prevent the user from inversely plugging the wireless signal receiver into USB port when the wireless signal receiver is plugged into the USB port of the computer. It has the error-proof effect.

For further understanding of the invention, reference is made to the following detailed description illustrating the embodiments and examples of the invention. The description is for illustrative purpose only and is not intended to limit the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
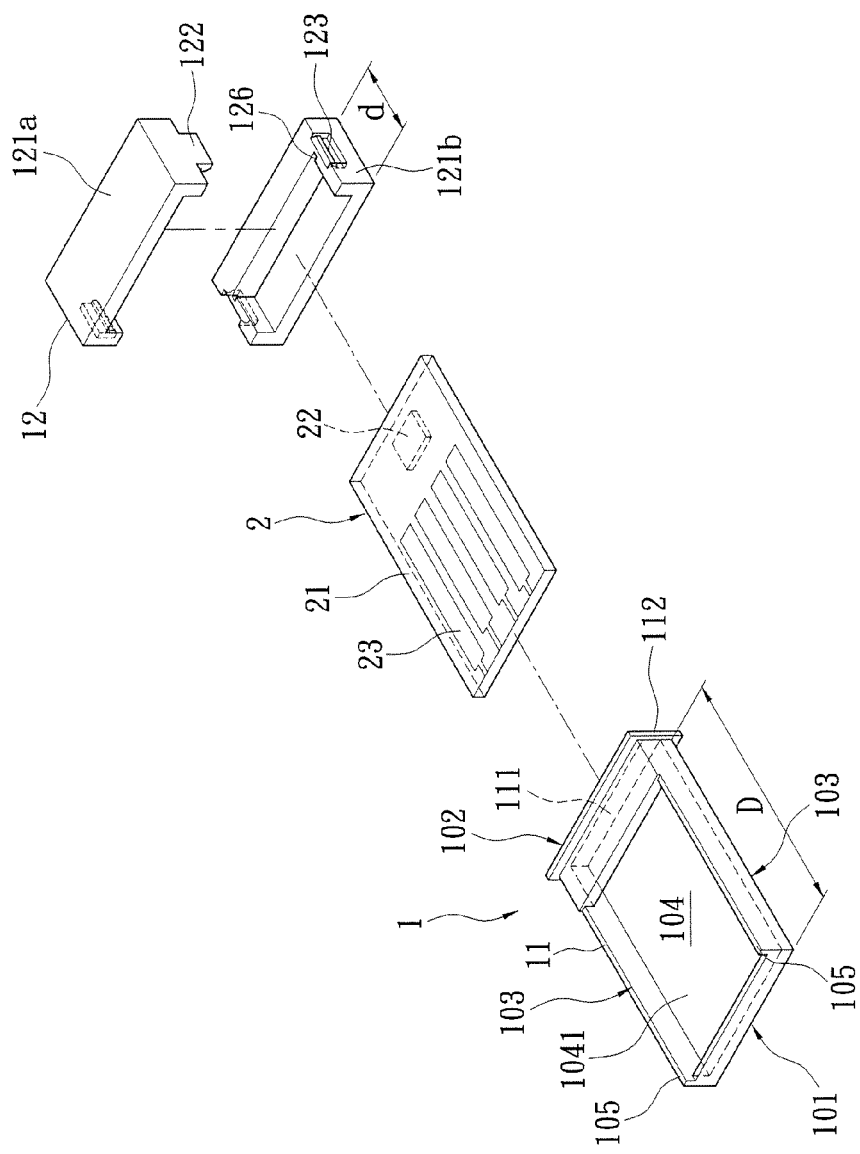
FIG. 1 is an exploded perspective view of the wireless signal receiver of the present invention.

Reference is made to FIG. 1. The wireless signal receiver includes a housing 1, and a receiving module 2.

The housing 1 has a front portion 101, a rear portion 102 and two side portions 103. The housing 1 has an installing space 104 having an opening 1041. The opening 1041 is located at the front portion 101. Protruding ribs 105 respectively protrude from each of the two wall surfaces that form the two side portions 103 of the housing 1, and each of the protruding ribs 105 extends from the front portion 101 of the housing 1 to the rear portion 102 at a proper distance.

The receiving module 2 at least includes a circuit board 21, a receiving chip 22 electrically coupled with the circuit board 21, and electric-conducting contacting portions 23 electrically coupled with the circuit board 21. According to the specification of the USB port of the computer, the quantity of the electric-conducting contacting portions 23 is four, and the electric-conducting contacting portions 23 are disposed on the circuit board 21 in parallel. The electric-conducting contacting portion 23 can be an electric-conducting pin or golden finger. In a preferred embodiment, the electric-conducting contacting portion 23 is a golden finger. The receiving chip 22 can be located above or below the circuit board 21. The receiving chip 22 can be a Bluetooth chip or a RF chip.

In this embodiment, the receiving module 2 is located in the installing space 104 of the housing 1. The electric-conducting contacting portions 23 of the receiving module 2 expose to outside of the opening 1041 of the housing 1.

Figure 2:
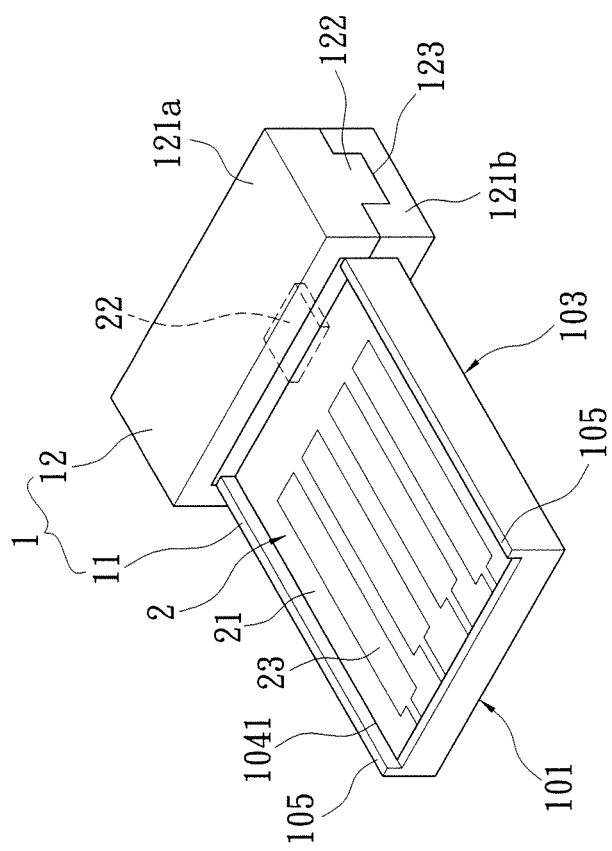
FIG. 2 is an assembly perspective view of the wireless signal receiver of the present invention.
Figure 3:
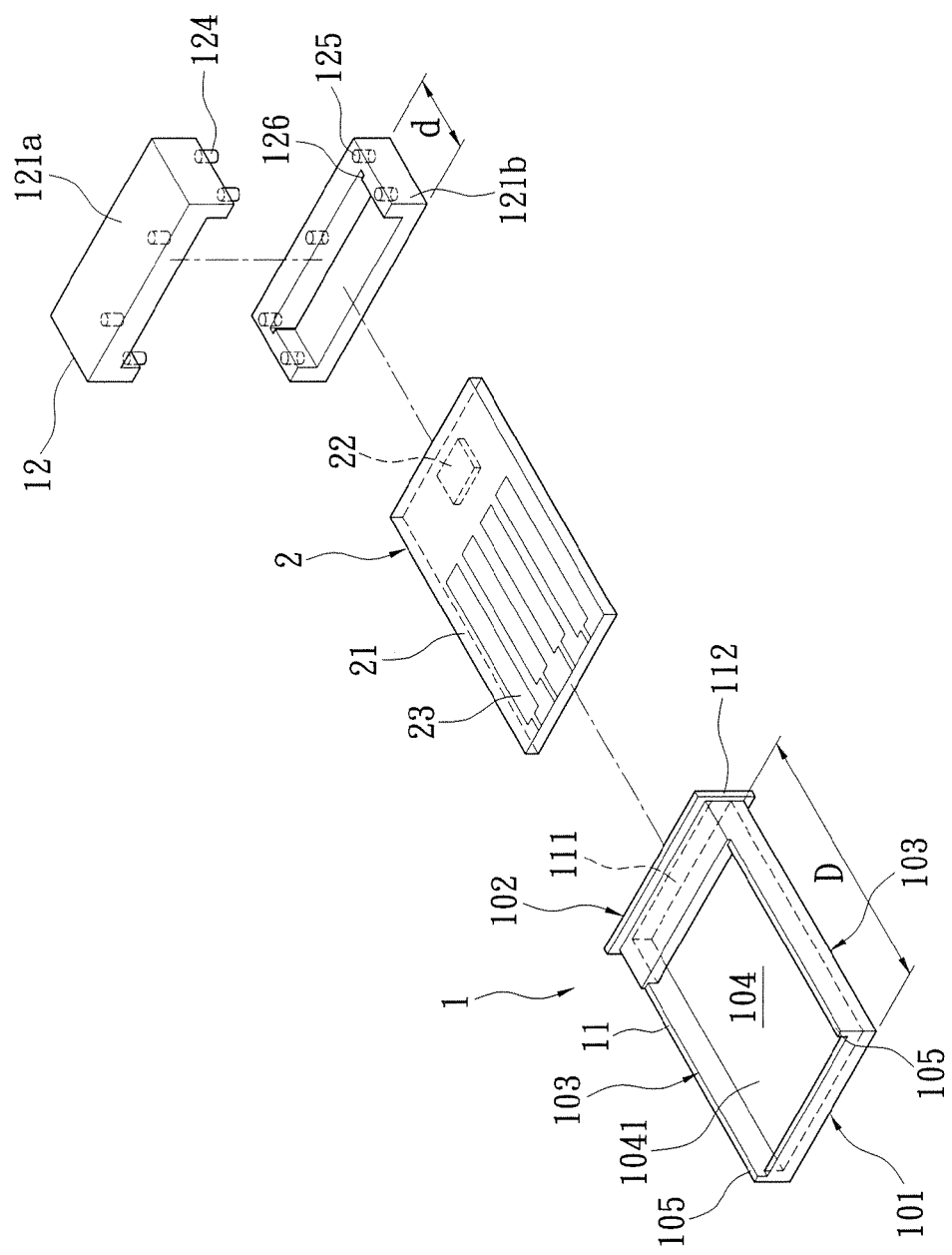
FIG. 3 is another exploded perspective view of the wireless signal receiver of the present invention.

FIGS. 1-3 show the first embodiment of the present invention. The housing 1 includes an insulating base 11 and a blocking shell 12.

The insulating base 11 is made of an insulting plastic material. In this embodiment, the front portion 101, the rear portion 103 and the two side portions is the front portion, the rear portion and the two side portions of the insulating base 11. The installing space 104 with the opening 1041 and the protruding ribs 103 are all formed on the insulating base 11. The insulating base 11 has an installing opening 111 linked with the installing space 104. The installing opening 111 is located at the rear portion 102 of the insulating base 11, and is formed on the rear surface of the insulating base 11. The wall surface that forms the rear portion 102 of the insulating base 12 protrudes outwards to form a wedging portion 112.

The blocking shell 12 has two shell bases 121a, 121b that can be butted together. The two shell bases 121a, 121b can be butted via a wedging way. This means that the two shell bases 121a, 121b respectively have a wedging hook 122 and a wedging trough 123 (as shown in FIG. 1). Alternatively, the two shell bases 121a, 121b respectively have a wedging tenon 124 and a wedging hole 125. The wedging tenon 124 is wedged into the wedging hole 125 so that the two shell bases 121a, 121b are fastened (as shown in FIG. 3). The butting way of the two shell bases 121a, 121b is not limited to above. The two shell bases 121a, 121b can be butted together in a top-bottom way or a left-right way. Each of the two shell bases 121a, 121b respectively have a wedging trough.

When the wireless signal receiver is assembled, the receiving module 2 is installed into the installing space 104 via the installing opening 111 of the insulating base 11, and is fastened by the walls that form the installing space 104 of the insulating base 11. The electric-conducting contacting portions 23 of the receiving module 2 expose to outside of the opening 1041 of the insulating base 11.

The blocking shell 12 is assembled at the rear portion of the insulating base 11. The blocking shell 12 is used for enclosing the installing opening 111 of the insulating base 11 and blocking the receiving module 2 to prevent the receiving module from sliding to outside of the installing opening 111 of the insulating base 11. In this embodiment, two shell bases 121a, 121b are butted together, and is wedged to the rear portion 102 of the insulating base 11 and is wedged to the wedging portion 112 of the insulating base 11 to be assembled on the insulating base 11. The wedging portion 112 can be wedged into the wedging troughs 126 of the two shell bases 121a, 121b to prevent the two shell bases 121a, 121b from escaping from the rear side of the insulating base 11. In a preferred embodiment, the length (d) of the blocking shell 12 is less tan or equal to the length (D) of the insulating base 11.

When this embodiment is used, the front portion 101 of the insulating base 11 is aimed at the USB port of the computer and is plugged into the USB port. The electric-conducting contacting portions 23 of the receiving module 2 electrically contact the electric-conducting contacting portions of the USB port. Thereby, the receiving chip 22 of the receiving module 2 transmits the signal with the computer. When the wireless signal receiver receives signals from the wireless computer peripheral, the computer and the wireless computer peripheral can perform a wireless transmission and a wireless control. Moreover, because the front portion 101 of the housing 1 forms two protruding ribs 105, the wireless signal receiver has an error-proof function. Thus means that the protruding ribs 105 can prevent the user from inversely plugging the wireless signal receiver into the USB port.

Figure 4:
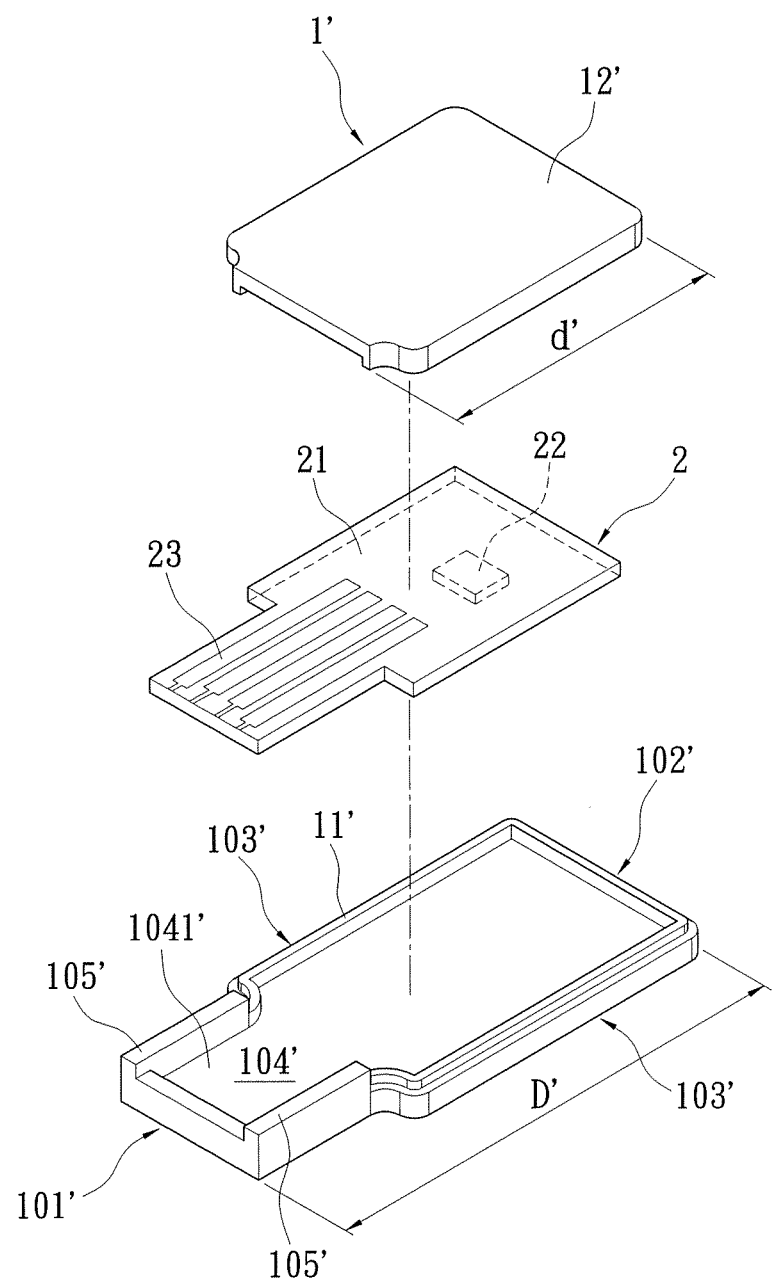
FIG. 4 is an exploded perspective view of the wireless signal receiver of the second embodiment of the present invention.
Figure 5:
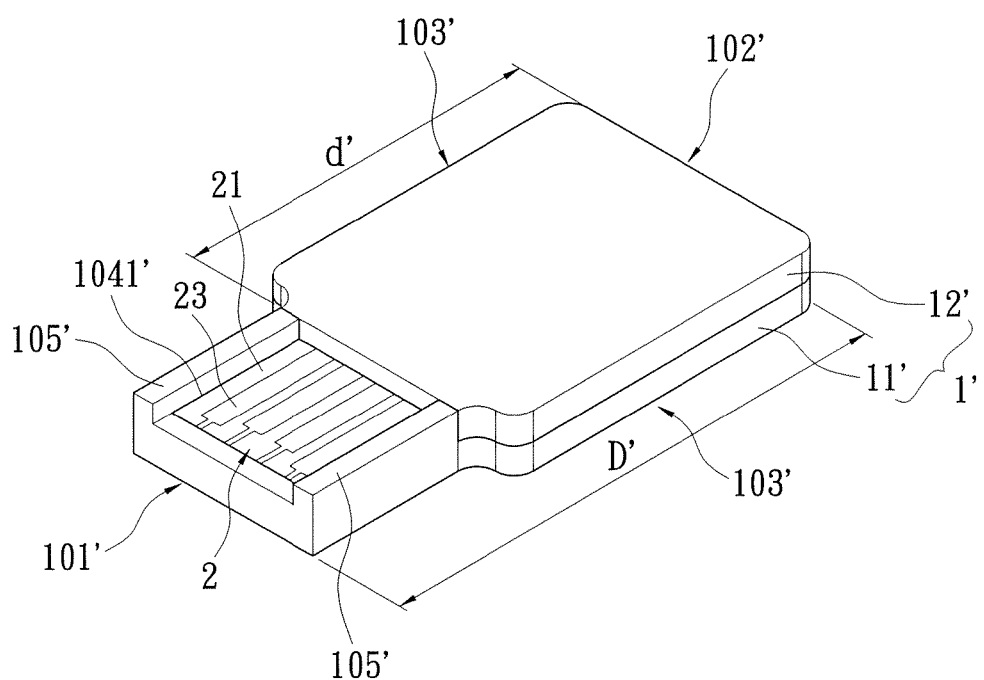
FIG. 5 is an assembly perspective view of the wireless signal receiver of the second embodiment of the present invention.

Reference is made to FIGS. 4 and 5, which show the second embodiment. The difference between the second embodiment and the first embodiment is described as below. The housing 1' includes a bottom base 11' and an upper cover 12' that can be butted with the bottom base 11'. The front portion 101' of the housing 1' is the front portion of the bottom base 11'. The length (d') of the upper cover 12' is shorter than the length (D') of the bottom base 11' so that the front portion 101' of the bottom base 11' protrudes to the upper cover 12'.

The bottom base 11' and the upper cover 12' form the installing space 104' of the housing 1' for receiving the receiving module 2. The front portion 101' of the bottom base 11' forms the opening 1041' and the protruding ribs 104'. Furthermore, the butting way for the bottom base 11' and the upper cover 12' is the same as butting way for the two shell bases 121a, 121b of the blocking shell 12 in the first embodiment, not repeated again.

When this embodiment is used, the front portion 101' of the housing 1' is aimed at the USB port of the computer and is plugged into the USB port. The electric-conducting contacting portions 23 of the receiving module 2 electrically contact the electric-conducting contacting portions of the USB port to achieve the effects that are the same as the first embodiment.

By assembling the receiving module 2 in the installing spaces 104, 104' of the housings 1, 1', the receiving module 2 is directly received in the housings 1, 1' and the electric-conducting contacting portions 23 directly expose to outside of the openings 1041, 1041' of the front portions 101, 101' of the housings 1, 1'. Thereby, the total length is reduced. Comparing to the prior art, the total length of the wireless signal receiver is about 1.5-3 cm. The required interior space of the wireless computer peripheral for the wireless signal receiver is reduced, especially for a wireless mouse. In one embodiment, when the length (d) of the blocking shell 12 is less than or equal to the length (D) of the insulating body 11, the total length of the wireless signal receiver is about 1.5-2 cm.

Furthermore, the receiving module 2 is located in the installing spaces 104, 104' of the housings 1, 1'. If the receiving module 2 is damaged during the manufacturing process or being used, the receiving module 2 can be easily taken out and replaced by merely disassembling the housings 1, 1'. The housing is not destroyed. When the receiving module of the wireless receiver of the prior art is damaged, the receiving module usually cannot be replaced due to the structure of the wireless receiver of the prior art has to be destroyed. Therefore, the wireless signal receiver of the present invention can be easily disassembled and maintained.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A wireless signal receiver, comprising:
   a housing including a bottom base and an upper cover partially covered on the bottom base, the bottom base having a front portion, a rear portion and two side portions respectively protruded from two side edges of the rear portion, wherein the upper cover has a length substantially equal to a length of the rear portion of the bottom base, and the upper cover is butted with the rear portion of the bottom base, so that the front portion is protruded beyond the upper cover, wherein the housing has an installing space with an upward opening, wherein the front portion has a pair of protruding ribs respectively protruded from two side edges thereof, and a traverse protruding rib protruded from a front edge thereof between the pair of protruding ribs, wherein a height of the protruding ribs is higher than that of the traverse protruding rib, so at to prevent the wireless signal receiver from inversely plugged into a receiving port; and a receiving module located in the installing space of the housing, wherein the receiving module includes a circuit board, a receiving chip electrically coupled with the circuit board, and a plurality of electric-conducting contacting portions electrically coupled with the circuit board, and the electric-conducting contacting portions exposes to outside of the opening, wherein the electric-conducting contacting portions have a top surface substantially flushed with a top end of the traverse protruding rib.

2. The wireless signal receiver as claimed in claim 1, wherein the quantity of the electric-conducting contacting portions is four.

* * * * *